(12) United States Patent
Takahashi

(10) Patent No.: US 12,249,573 B2
(45) Date of Patent: Mar. 11, 2025

(54) SEMICONDUCTOR DEVICE HAVING SHIELD PATTERNS

(71) Applicant: MICRON TECHNOLOGY, INC., Boise, ID (US)

(72) Inventor: Tetsuji Takahashi, Inagi (JP)

(73) Assignee: Micron Technology, Inc., Boise, ID (US)

( * ) Notice: Subject to any disclaimer, the term of this patent is extended or adjusted under 35 U.S.C. 154(b) by 409 days.

(21) Appl. No.: 17/815,098

(22) Filed: Jul. 26, 2022

(65) Prior Publication Data

US 2024/0038655 A1 Feb. 1, 2024

(51) Int. Cl.
*H01L 23/522* (2006.01)
*H10B 12/00* (2023.01)

(52) U.S. Cl.
CPC ...... *H01L 23/5225* (2013.01); *H01L 23/5226* (2013.01); *H10B 12/50* (2023.02)

(58) Field of Classification Search
CPC .. H01L 23/5225; H01L 23/5226; H10B 12/50
USPC ......................................................... 257/773
See application file for complete search history.

(56) References Cited

U.S. PATENT DOCUMENTS 11,178,749 B2 * 11/2021 Zeng .................... H05K 1/0219

* cited by examiner

*Primary Examiner* — Tu-Tu V Ho
(74) *Attorney, Agent, or Firm* — Dorsey & Whitney LLP

(57) ABSTRACT

Disclosed herein is an apparatus that includes a plurality of signal wiring patterns, a plurality of shield patterns each provided between corresponding two of the signal wiring patterns, a common pattern coupled to each of the plurality of shield patterns, and a transistor coupled between the common pattern and a power line supplied with a fixed power potential.

20 Claims, 6 Drawing Sheets

SEMICONDUCTOR DEVICE HAVING SHIELD PATTERNS

BACKGROUND

A signal formed of a plurality of bits such as an address signal, a command signal, and a user data signal has coupling noise generated between wiring patterns that transmit each bit. In order to reduce such coupling noise, there is a case where shield patterns are provided between wiring patterns. Normally, shield patterns are fixed at a ground potential.

DETAILED DESCRIPTION

Various embodiments of the present disclosure will be explained below in detail with reference to the accompanying drawings. The following detailed description refers to the accompanying drawings that show, by way of illustration, specific aspects, and various embodiments of the present disclosure. The detailed description provides sufficient detail to enable those skilled in the art to practice these embodiments of the present disclosure. Other embodiments may be utilized, and structural, logical, and electrical changes may be made without departing from the scope of the present disclosure. The various embodiments disclosed herein are not necessary mutually exclusive, as some disclosed embodiments can be combined with one or more other disclosed embodiments to form new embodiments.

Figure 1:
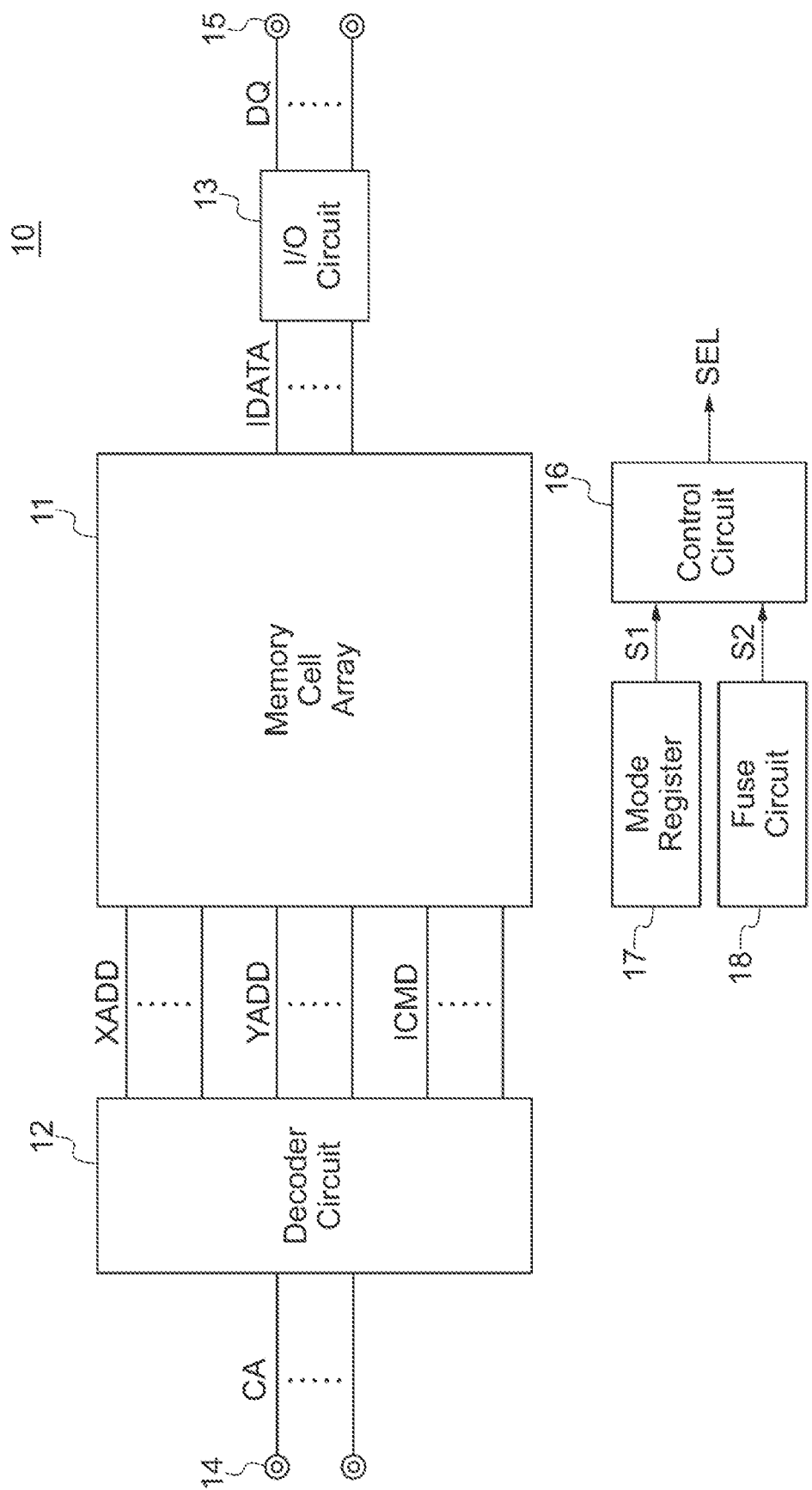
FIG. 1 is a block diagram showing a configuration of a semiconductor device according to the present disclosure.

FIG. 1 is a block diagram showing a configuration of a semiconductor device according to the present disclosure. A semiconductor device 10 shown in FIG. 1 is a DRAM (Dynamic Random Access Memory), for example. The semiconductor device 10 includes a memory cell array 11, a decoder circuit 12 that decodes a command address signal CA, and an I/O circuit 13 that inputs and outputs data with respect to the memory cell array 11. The decoder circuit 12 receives the command address signal CA input from an external controller via one of command address terminals 14, and then decodes the signal to generate a row address XADD, a column address YADD, an internal command ICMD, and the like. In a read operation, read data DQ read from the memory cell array 11 is output in parallel to data I/O terminals 15 via the I/O circuit 13. In a write operation, write data DQ input in parallel from an external controller to the data I/O terminals 15 is written in the memory cell array 11 via the I/O circuit 13.

The command address signal CA input to the decoder circuit 12 is a signal formed of a plurality of bits, and changes of these bits occur substantially at the same time. The row address XADD output from the decoder circuit 12 is also a signal formed of a plurality of bits, and changes of these bits occur substantially at the same time. The same also applies to the column address YADD and the internal command ICMD. The memory cell array 11 and the I/O circuit 13 are coupled to each other by a plurality of data buses. In a read operation, internal data IDATA formed of a plurality of bits and read from the memory cell array 11 is transferred in parallel to the I/O circuit 13. In a write operation, the internal data IDATA formed of a plurality of bits and output from the I/O circuit 13 is supplied in parallel to the memory cell array 11.

The semiconductor device 10 shown in FIG. 1 further includes a control circuit 16. The control circuit 16 is a circuit that generates a mode selection signal SEL. The value of the mode selection signal SEL is switched with a parameter S1 set in a mode register 17 and a parameter S2 written in a fuse circuit 18. By issuing a mode register set command, the parameter S1 set in the mode register 17 can be rewritten by an external controller. Examples of the parameter S1 set in the mode register 17 include a parameter related to clock frequencies. Meanwhile, the parameter S2 is written in the fuse circuit 18 at a manufacturing stage of the semiconductor device 10, so that users cannot rewrite the parameter S2. Examples of the parameter S2 written in the fuse circuit 18 include a parameter related to the operation speed of the semiconductor device 10 due to production tolerance.

Figure 2A:
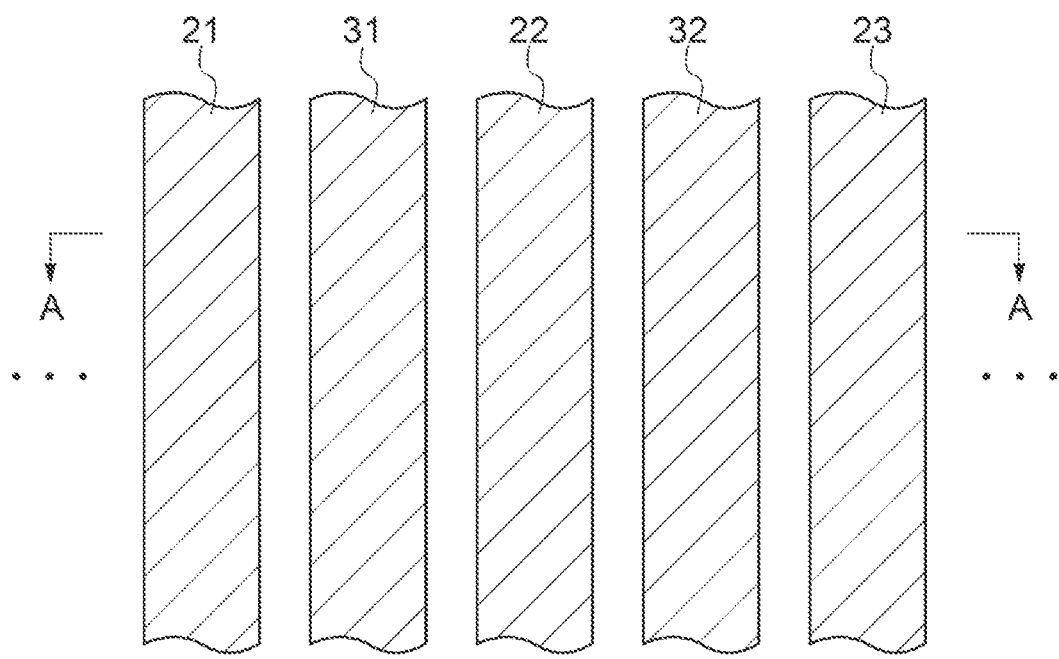
FIG. 2A is a schematic plan view of wiring patterns included in the semiconductor device.
Figure 2B:
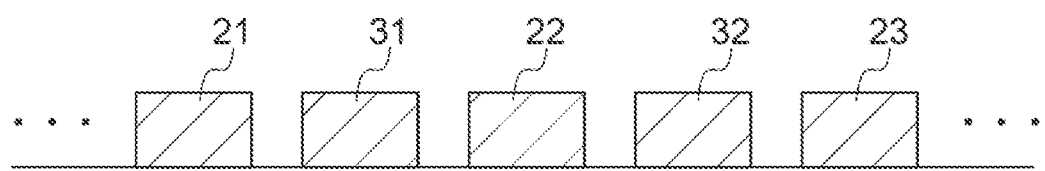
FIG. 2B is a schematic sectional view along a line A-A shown in FIG. 2A.

FIG. 2A is a schematic plan view of wiring patterns included in the semiconductor device 10. FIG. 2B is a schematic sectional view along a line A-A shown in FIG. 2A. In FIGS. 2A and 2B, three signal wiring patterns 21 to 23 and two shield patterns 31 and 32 are shown. The signal wiring patterns may convey various information, such as address information, command information, and/or user data information. For example, the signal wiring patterns 21 to 23 are wiring patterns that may transmit the command address signal CA, the row address XADD, the column address YADD, the internal command ICMD, the internal data IDATA, or the read/write data DQ described above. Therefore, in practice, as many signal wiring patterns as the number of bits forming these signals are required. The shield pattern 31 is provided between the signal wiring patterns 21 and 22. The shield pattern 32 is provided between the signal wiring patterns 22 and 23. In this manner, a plurality of signal wiring patterns are provided not to be immediately adjacent to one another, and shield patterns are provided between adjacent signal wiring patterns. With this configuration, coupling noise generated between signal wiring patterns is reduced. As shown in FIG. 2B, the signal wiring patterns 21 to 23 and the shield patterns 31 and 32 are provided on mutually the same wiring layer.

Figure 3:
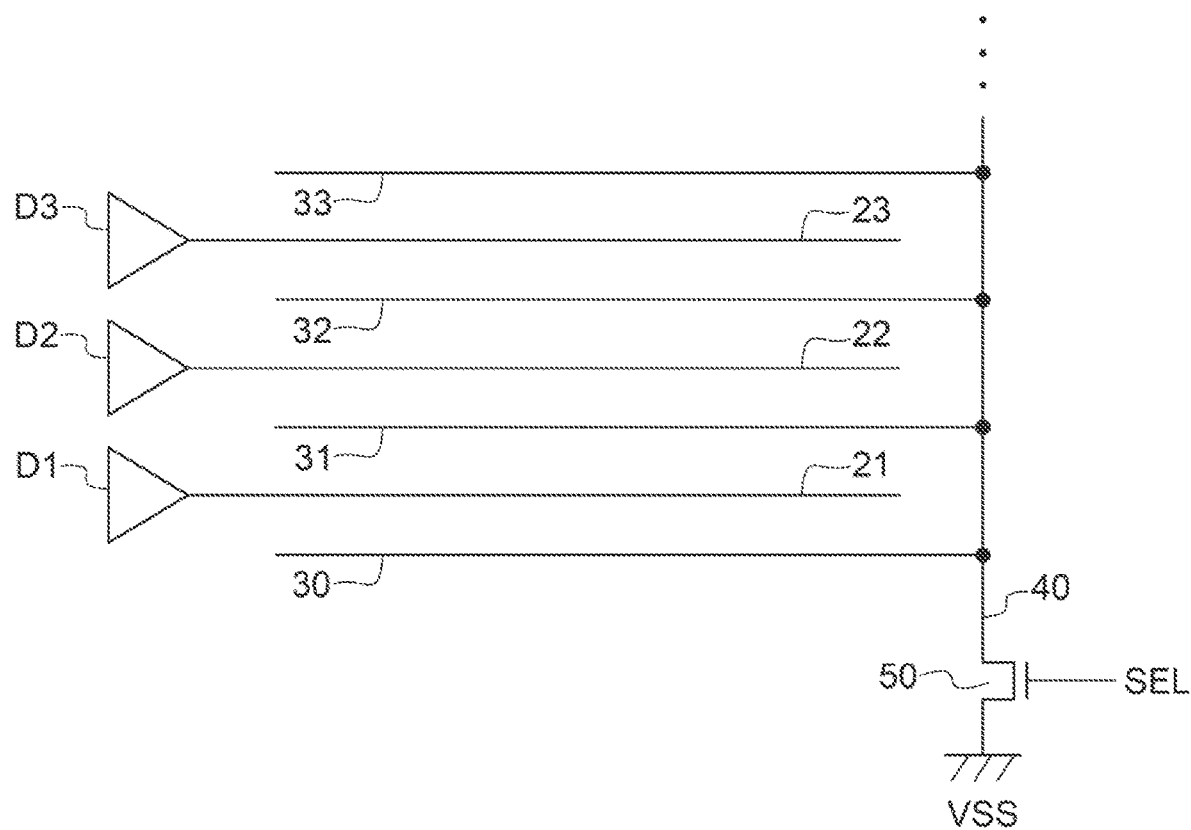
FIG. 3 is a schematic diagram for explaining a coupling relation among shield patterns.

As shown in FIG. 3, the shield patterns 30 and 31 and shield patterns 32, 33 onwards are commonly coupled to a common pattern 40. The common pattern 40 is coupled to a power line that is supplied with a ground potential VSS via a transistor 50. The mode selection signal SEL generated by the control circuit 16 is supplied to a gate electrode of the transistor 50. With this configuration, in a first operation mode in which the mode selection signal SEL is at a high level, the transistor 50 is brought into an ON state and the ground potential VSS is supplied to each of the shield patterns 30, 31, 32, 33 onwards via the common pattern 40. When each of the shield patterns 30, 31, 32, 33 onwards is fixed at the ground potential VSS, a floating capacity is generated between the signal wiring patterns 21, 22, 23 onwards and the shield patterns 30, 31, 32, 33 onwards, and thus coupling noise among the signal wiring patterns 21, 22, 23 onwards is reduced. With this configuration, even when the signal wiring patterns 21, 22, 23 onwards are driven simultaneously by driver circuits D1, D2, D3 onwards, waveform rounding can be sufficiently suppressed. Note that, since the floating capacity generated among the shield patterns 30, 31, 32, 33 onwards is charged and discharged each time the signal level on the signal wiring patterns 21, 22, 23 onwards is changed, a consumption current due to this phenomenon is generated. Meanwhile, in a second operation mode in which the mode selection signal SEL is at a low level, the transistor is brought into an OFF state and each of the shield patterns 30, 31, 32, 33 onwards is brought into a floating state. When each of the shield patterns 30, 31, 32, 33 onwards is in a floating state, the floating capacity between the signal wiring patterns 21, 22, 23 onwards and the shield patterns 30, 31, 32, 33 onwards becomes very small, so that the consumption current caused by charge and discharge on the floating capacity is decreased. Note that, in this case, shielding effectiveness produced by the shield patterns 30, 31, 32, 33 onwards becomes less.

Therefore, in a case where a high speed operation is required, for example, when a clock signal with a high frequency is used, high signal quality can be secured by setting the mode selection signal SEL at a high level. On the other hand, when a clock signal with a low frequency is used, the consumption current can be decreased by setting the mode selection signal SEL at a low level. In this case, although the signal quality slightly deteriorates, when a clock signal with a low frequency is used, since there is a sufficient timing margin, normal operations can be secured. Further, when the operation speed grade of the semiconductor device 10 is estimated to be faster than a design value, by writing a predetermined parameter in the fuse circuit 18 at a manufacturing stage of the semiconductor device 10, the initial value of the mode selection signal SEL may be set at a low level. When the parameter S2 written in the fuse circuit 18 and the parameter S1 set in the mode register 17 conflict with each other, it is permissible to design to prioritize the parameter S2 written in the fuse circuit 18 or to design to prioritize the parameter S1 set in the mode register 17. Alternatively, when a predetermined parameter S2 is written in the fuse circuit 18, the level of the mode selection signal SEL may be fixed to disable switching of the mode selection signal SEL using the mode register 17.

Figure 4A:
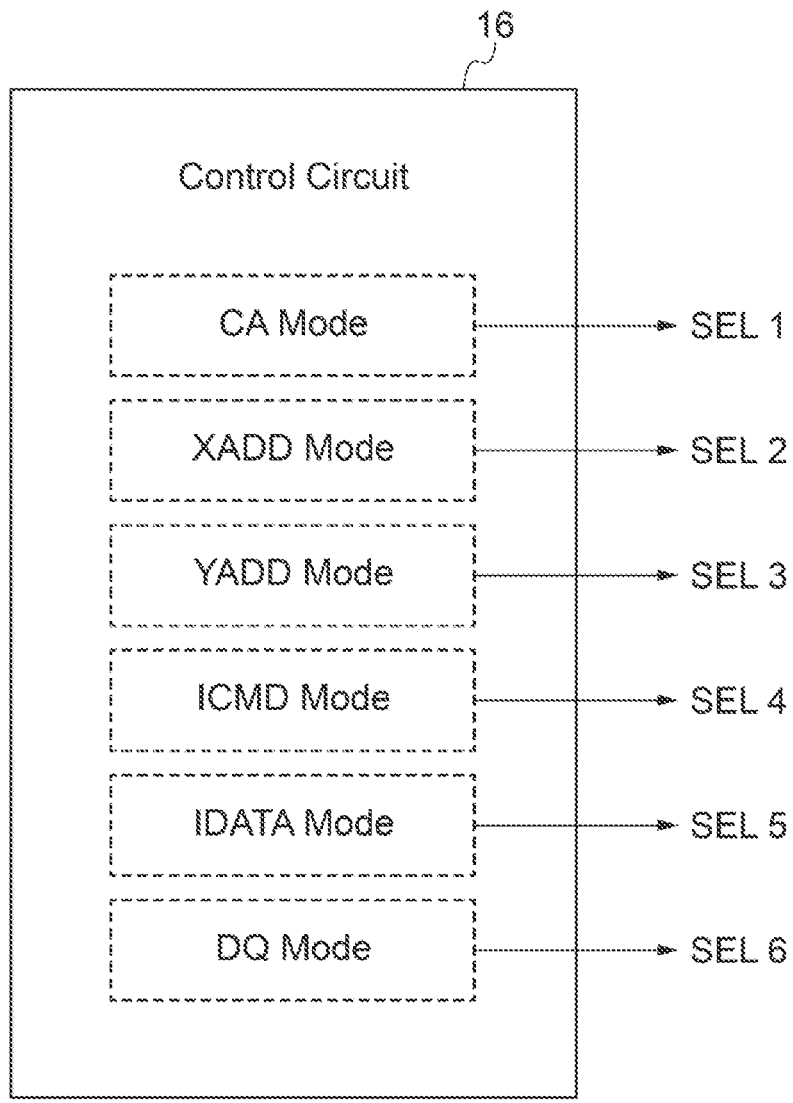
FIG. 4A is a block diagram of a control circuit according to a modification.
Figure 4B:
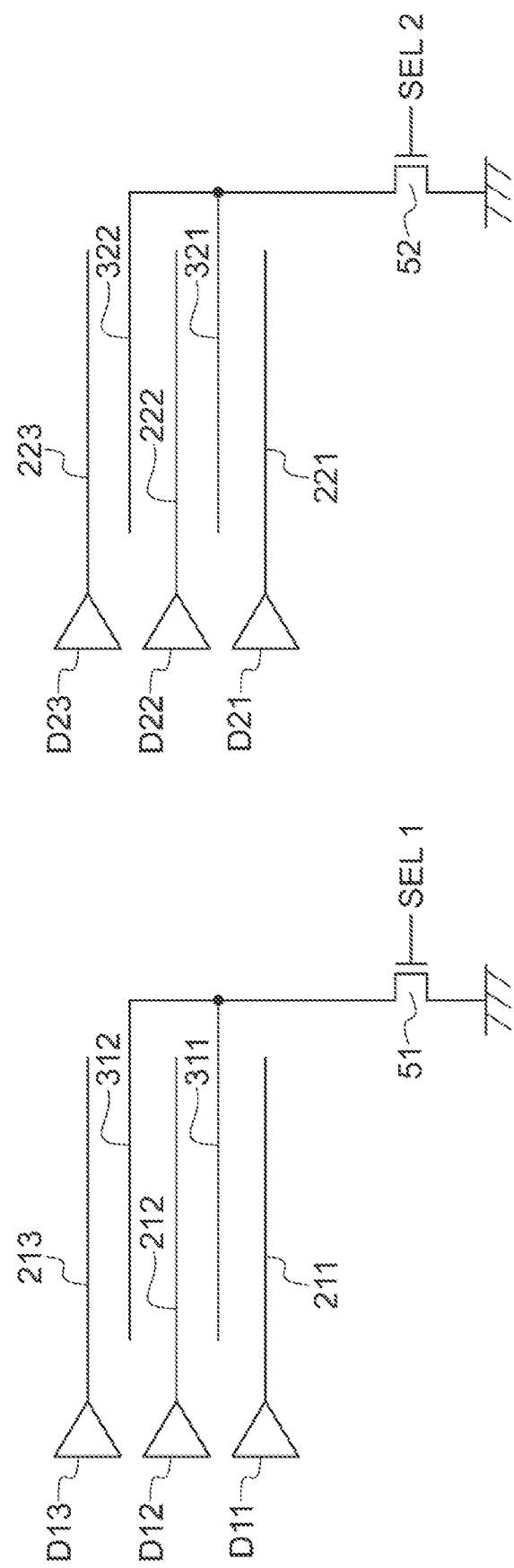
FIG. 4B is a schematic diagram for explaining a coupling relation among shield patterns according to the modification.

Potential control of shield patterns may be executed uniformly in the entirety of the semiconductor device 10 or may be executed only for some of the shield patterns. For example, as for shield patterns provided between wiring patterns that transmit the internal data IDATA, these shield patterns are controlled to be at the ground potential VSS or in a floating state based on the mode selection signal SEL. Meanwhile, as for shield patterns provided between other wiring patterns, these shield patterns may be fixed at the ground potential VSS regardless of the mode selection signal SEL. Alternatively, as shown in FIG. 4A, it is permissible that the control circuit 16 generates a plurality of mode selection signals SEL1 to SEL6 and the levels of respectively corresponding shield patterns are controlled by using the mode selection signals SEL1 to SEL6. In the example shown in FIG. 4A, the shield pattern between wiring patterns that transmit the command address signal CA is controlled with the mode selection signal SEL1, the shield pattern between wiring patterns that transmit the row address XADD is controlled with the mode selection signal SEL2, the shield pattern between wiring patterns that transmit the column address YADD is controlled with the mode selection signal SEL3, the shield pattern between wiring patterns that transmit the internal command ICMD is controlled with the mode selection signal SEL4, the shield pattern between wiring patterns that transmit the internal data IDATA is controlled with the mode selection signal SEL5, and the shield pattern between wiring patterns that transmit the read/write data DQ is controlled with the mode selection signal SEL6. With this configuration, for example, as shown in FIG. 4B, as for shield patterns 311 and 312 among signal wiring patterns 211 to 213 simultaneously driven by driver circuits D11 to D13, these shield patterns can be controlled to be at the ground potential VSS or in a floating state by controlling a transistor 51 using the mode selection signal SEL1. As for shield patterns 321 and 322 among signal wiring patterns 221 to 223 simultaneously driven by driver circuits D21 to D23, these shield patterns can be controlled to be at the ground potential VSS or in a floating state by controlling a transistor 52 using the mode selection signal SEL2.

Figure 5:
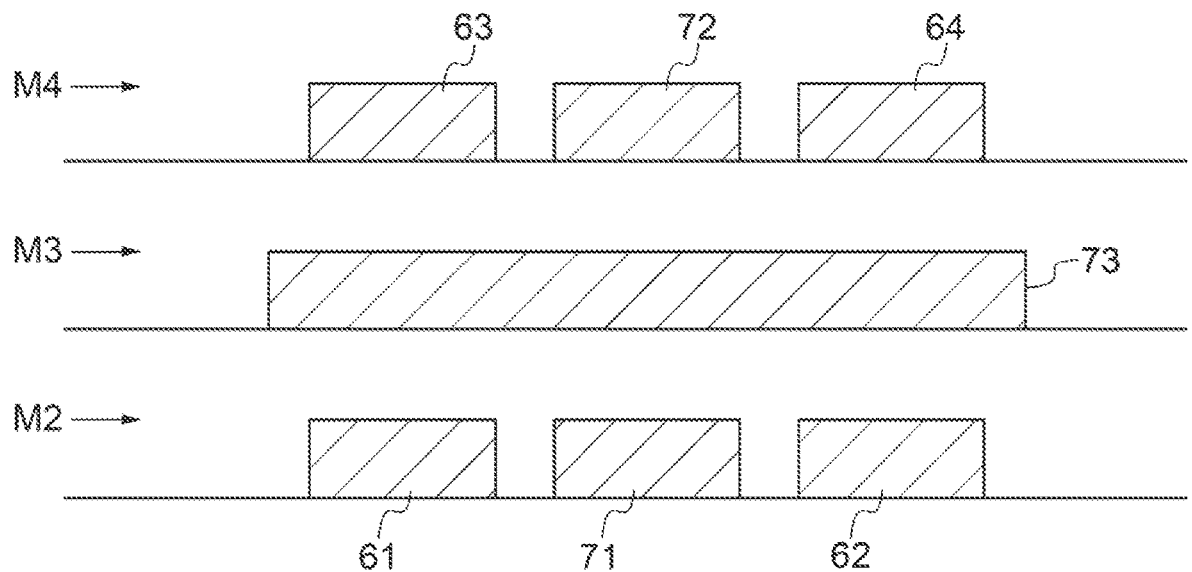
FIG. 5 is a schematic sectional view of signal wiring patterns and shield patterns according to the modification.

It is not essential to position wiring patterns and shield patterns on the same wiring layer. As the example shown in FIG. 5, it is permissible to provide signal wiring patterns 61 and 62 and a shield pattern 71 on a wiring layer M2, signal wiring patterns 63 and 64 and a shield pattern 72 on a wiring layer M4, and a shield pattern 73 on a wiring layer M3 that is positioned between the wiring layer M2 and the wiring layer M4. With this configuration, coupling noise generated between the signal wiring patterns 61 and 62 is reduced by the shield pattern 71 and coupling noise generated between the signal wiring patterns 63 and 64 is reduced by the shield pattern 72. Further, coupling noise generated between the signal wiring patterns 61 and 63 and coupling noise generated between the signal wiring patterns 62 and 64 are reduced by the shield pattern 73. In this case, it is permissible to configure that potentials of the shield patterns 71 to 73 are controlled uniformly or these potentials are controlled for each of the shield patterns 71 to 73 independently.

Although various embodiments have been disclosed in the context of certain preferred embodiments and examples, it will be understood by those skilled in the art that the scope of the present disclosure extends beyond the specifically disclosed embodiments to other alternative embodiments and/or uses of the embodiments and obvious modifications and equivalents thereof. In addition, other modifications which are within the scope of this disclosure will be readily apparent to those of skill in the art based on this disclosure. It is also contemplated that various combination or subcombination of the specific features and aspects of the embodiments may be made and still fall within the scope of the disclosure. It should be understood that various features and aspects of the disclosed embodiments can be combined with or substituted for one another in order to form varying modes of the disclosed embodiments. Thus, it is intended that the scope of at least some of the present disclosure should not be limited by the particular disclosed embodiments described above.

The invention claimed is:
1. An apparatus comprising:
   a plurality of signal wiring patterns;
   a plurality of shield patterns each provided between corresponding two of the signal wiring patterns, the plurality of shield patterns being short-circuited to one another; and
   a control circuit configured to control a potential of the plurality of shield patterns.

2. The apparatus as claimed in claim 1, further comprising a driver circuit configured to simultaneously output a plurality of signals to the plurality of signal wiring patterns, respectively.

3. The apparatus as claimed in claim 2, wherein the control circuit is configured to bring a potential of the plurality of shield patterns into a fixed predetermined level in a first operation mode.

4. The apparatus as claimed in claim 3, wherein the fixed predetermined level is a ground potential.

5. The apparatus as claimed in claim 3, wherein the control circuit is configured to bring the plurality of shield patterns into a floating state in a second operation mode.

6. The apparatus as claimed in claim 5, wherein the control circuit is configured to select an operation mode by a selection signal.

7. The apparatus as claimed in claim 6, further comprising a mode register configured to output the selection signal.

8. The apparatus as claimed in claim 6, further comprising a fuse circuit configured to output the selection signal.

9. The apparatus as claimed in claim 1, wherein the plurality of signal wiring patterns and the plurality of shield patterns are provided on the same wiring layer.

10. An apparatus comprising:
a plurality of signal wiring patterns;
a plurality of shield patterns each provided between corresponding two of the signal wiring patterns;
a common pattern coupled to each of the plurality of shield patterns; and
a transistor coupled between the common pattern and a power line supplied with a fixed power potential.

11. The apparatus as claimed in claim 10, further comprising a driver circuit configured to simultaneously output a plurality of signals to the plurality of signal wiring patterns, respectively.

12. The apparatus as claimed in claim 11, further comprising a control circuit configured to control the transistor.

13. The apparatus as claimed in claim 12, wherein the control circuit is configured to bring the transistor into an ON state in a first operation mode so that the plurality of shield patterns are commonly supplied with the fixed power potential.

14. The apparatus as claimed in claim 13, wherein the control circuit is configured to bring the transistor into an OFF state in a second operation mode so that the plurality of shield patterns are brought into a floating state.

15. The apparatus as claimed in claim 10, wherein the plurality of signal wiring patterns convey one of address information, command information, and user data information.

16. An apparatus comprising:
a first driver circuit configured to output a plurality of first signals respectively to a plurality of first signal wiring patterns substantially at the same time;
a second driver circuit configured to output a plurality of second signals respectively to a plurality of second signal wiring patterns substantially at the same time;
a plurality of first shield patterns each provided between corresponding two of the first signal wiring patterns;
a plurality of second shield patterns each provided between corresponding two of the second signal wiring patterns; and
a control circuit configured to control a potential of the first shield patterns responsive to a first control signal and control a potential of the second shield patterns responsive to a second control signal.

17. The apparatus as claimed in claim 16, further comprising a mode register configured to store at least one of the first and second control signals.

18. The apparatus as claimed in claim 16, further comprising a fuse circuit configured to store at least one of the first and second control signals.

19. The apparatus as claimed in claim 16, wherein the plurality of first signal wiring patterns convey one of address information, command information, and user data information.

20. The apparatus as claimed in claim 19, wherein the plurality of second signal wiring patterns convey remaining one of the address information, command information, and user data information.

* * * * *